United States Patent [19]

Narui et al.

[11] Patent Number: 5,757,029

[45] Date of Patent: May 26, 1998

[54] TRIANGULAR PYRAMIDAL SEMICONDUCTOR STRUCTURE AND OPTICAL DEVICE USING THE SAME

[75] Inventors: Hironobu Narui; Masato Doi; Hendrik Sabert, all of Kanagawa, Japan

[73] Assignee: Sony Corporation, Tokyo, Japan

[21] Appl. No.: 745,155

[22] Filed: Nov. 7, 1996

[30] Foreign Application Priority Data

Nov. 10, 1995 [JP] Japan .................................. 7-292943

[51] Int. Cl.$^6$ .................... H01L 29/04; H01L 31/036; H01L 27/15; H01L 31/12
[52] U.S. Cl. ........................ 257/64; 257/81; 257/14
[58] Field of Search ...................... 257/64, 81; 385/14

[56] References Cited

U.S. PATENT DOCUMENTS

| | | |
|---|---|---|
| 4,148,052 | 4/1979 | Nathanson . |
| 5,313,484 | 5/1994 | Arimoto . |
| 5,373,173 | 12/1994 | Ohata et al. . |
| 5,611,006 | 3/1997 | Tabuchi . |

*Primary Examiner*—Stephen Meier
*Attorney, Agent, or Firm*—Hill & Simpson

[57] ABSTRACT

A triangular pyramidal semiconductor structure which precisely splits light is provided by preventing an unnecessary crystal plane from growing on the boundary of side surface crystal planes of the triangular pyramidal semiconductor structure. The triangular pyramidal semiconductor structure is formed of either one of a {111} A crystal plane and a {111} B crystal plane and two {110} crystal planes.

6 Claims, 8 Drawing Sheets

FIG. 2
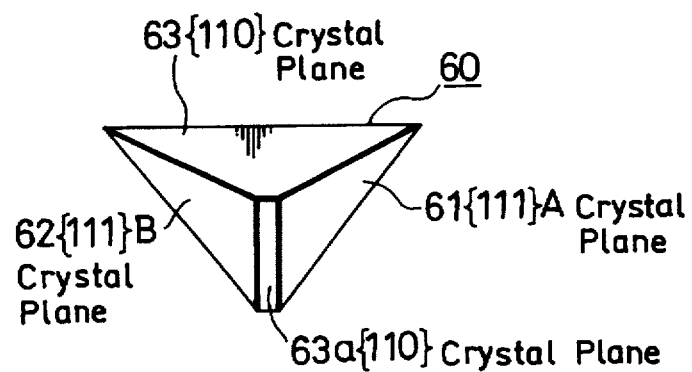
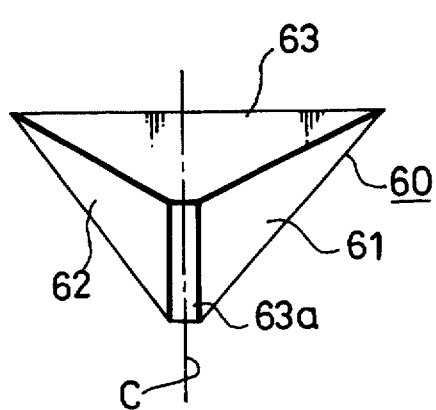
FIG. 3A
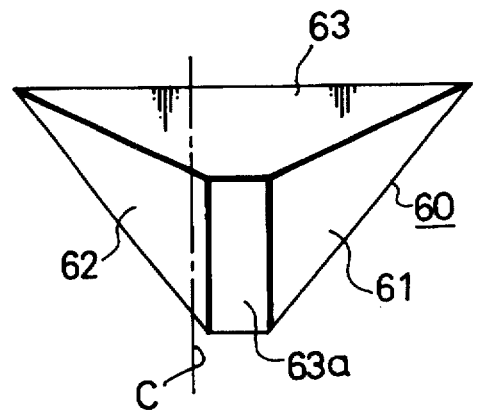
FIG. 3B

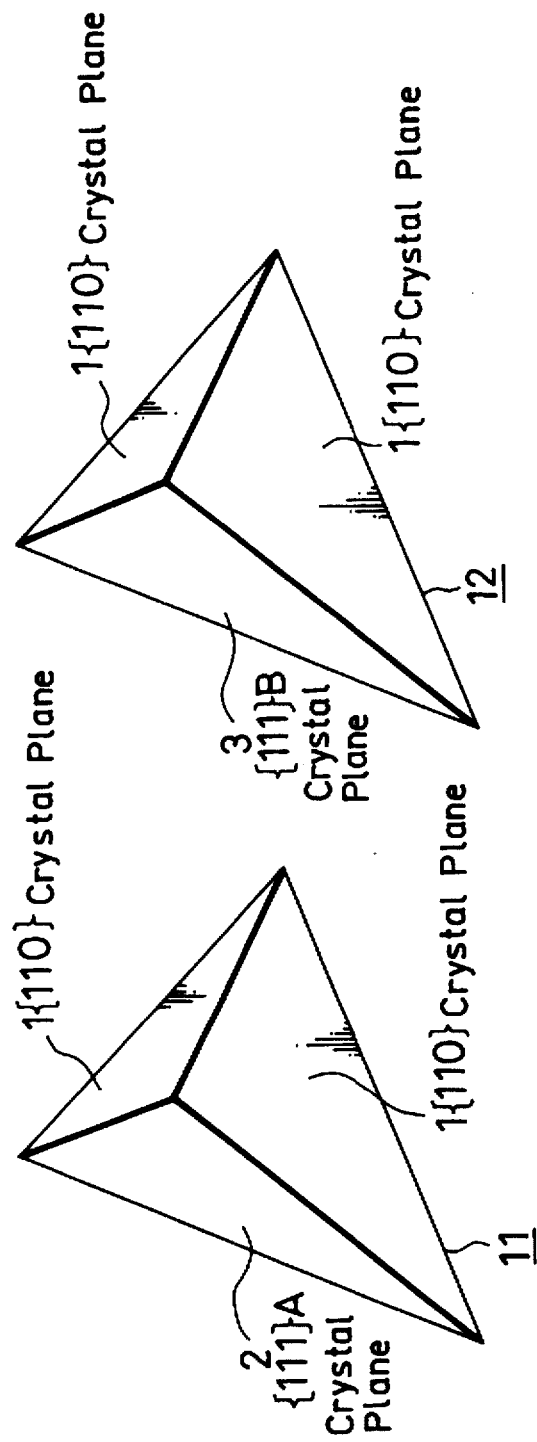

TRIANGULAR PYRAMIDAL SEMICONDUCTOR STRUCTURE AND OPTICAL DEVICE USING THE SAME

BACKGROUND OF THE INVENTION

1. Field of the Invention

The present invention relates to a triangular pyramidal semiconductor structure and an optical device using the same, suitable for use in an optical apparatus such as, for example, an optical pickup.

2. Description of the Related Art

In a conventional optical apparatus, for example, an optical pickup used in an optical disk drive or in a magnet-optical disk drive such as a so-called compact disc (CD) player, since optical assemblies such as a grating, or a beam splitter are individually assembled, the structure of the whole apparatus becomes extremely complicated and large. In addition, a strict alignment accuracy is required to set optical positioning of these optical assemblies when the optical assemblies are assembled in hybrid processes to form the optical pickup on a substrate.

On the other hand, in order to return emitted light back to a light-emitting unit such that the returned light is received by a light-receiving unit positioned near the light-emitting unit for detecting information recorded on a disk, light must be separated by a beam splitter or a hologram. In this case, the splitting of light inconveniently results in a reduction of an amount of light received by the light-receiving unit.

In view of the inconvenience mentioned above, a so-called CLC (confocal laser coupler) configuration has been proposed in order to allow for a reduced number of optical assemblies, simple alignment in optical positioning of the optical assemblies, as well as simplification and reduction in size of the entire structure of the apparatus. The CLC configuration is formed in a manner that a light-emitting unit is located at a confocal point of a converging means such as a lens, and a light-receiving unit is formed in the vinicity of the confocal point where the light-emitting means exists.

The same assignee of this application has proposed, as an example of an optical assembly having the CLC configuration, an optical apparatus as illustrated in FIG. 1 in Japanese Patent Application No. 7-37017.

FIG. 1 schematically illustrates a perspective view of the optical apparatus which has a light-emitting unit 52 having a semiconductor laser LD, a triangular pyramidal semiconductor structure 60 having 3 reflecting mirrors M, and a light-receiving unit 53 having light-receiving elements such as photodiodes all of which are monolithically formed on a common semiconductor substrate 51.

The triangular pyramidal semiconductor structure 60, having 3 reflecting mirrors M, is located near a confocal point of a light converging means and formed such that three side surfaces thereof face the semiconductor laser LD and the light-receiving elements having two pairs of bisected photodiodes $PD_{1a}$, $PD_{1b}$ and $PD_{2a}$, $PD_{2b}$, respectively.

Emitted laser light $L_F$ from the semiconductor laser LD of the light-emitting element 52 is reflected by the side surface of the reflecting mirror M opposite thereto and redirected upwardly. Reflected light is converged by a light converging means, not shown, to be irradiated on an irradiated body such as an optical disk, and reflected by the irradiated body to produce returned light $L_R$. The returned light $L_R$ is converged by the light converging means to a size within a light diffraction limit, i.e., to a diameter of $1.22\lambda/NA$, where $\lambda$ is the wavelength of the laser light, and NA is the numerical aperture of the light converging means on the laser side. The returned light $L_R$ passing through the light converging means is irradiated onto the reflecting mirror M of the triangular pyramidal semiconductor structure located near the confocal point.

Since an ordinary optical pickup for compact discs (CD) has an objective lens having an NA equal to 0.09 for a light converging means, returned light $L_R$ having a diameter of 10 μm is irradiated onto the reflecting mirror M.

The returned light $L_R$ is divided by the boundary between two side surfaces of the triangular pyramidal reflecting mirror M other than the side which reflects the light from the semiconductor laser LD, and reflected by the respective side surfaces so that divided light rays are received by the two pairs of bisected photodiodes $PD_{1a}$, $PD_{1b}$ and $PD_{2a}$, $PD_{2b}$, respectively.

Since the triangular pyramidal semiconductor structure 60 is located near the confocal point of the returned light $L_R$, and the returned light $L_R$ is split by the boundary between the two side surfaces of the triangular pyramid, a focus servo can be performed in accordance with a knife edge method.

The foregoing optical apparatus can be formed in such a manner that when, for example, the substrate surface is a (100) crystal plane, respective side surfaces of the triangular pyramidal semiconductor structure 60 are a {111} A crystal plane 61, a {111} B crystal plane 62, and a {110} crystal plane 63, respectively, as illustrated in FIG. 2. In addition, when the {110} crystal plane 63 forming an angle of 45° with respect to the substrate surface is used as the reflective surface opposite to the semiconductor laser LD of the light-emitting unit, such that the emitted light $L_F$ can be emitted in the direction perpendicular to the substrate surface.

However, if the triangular pyramidal semiconductor structure 60 is grown using the foregoing three crystal planes, an additional {110} crystal plane 63a is produced on the boundary between the {111} A crystal plane 61 and the {111} B crystal plane 62, as can be seen in FIG. 2 illustrating a top plan view of the triangular pyramidal semiconductor structure 60. Due to the presence of the {110} crystal plane 63a thus produced, when the returned light $L_R$ is split, a part of the light $L_R$ is reflected on this {110} crystal plane 63a and therefore cannot be received by an associated light-receiving element. Thus, an amount of light reaching the light-receiving element is reduced.

In addition, the light reflected on the {110} crystal plane 63a may act as stray light to adversely affect the operation of the optical apparatus.

Further, when the growth time is increased, the triangular pyramid becomes bigger progressively. In this event, however, the {110} crystal plane 63a grows and there is the difference in crystal plane growth rate between the {111} A crystal plane and the {111} B crystal plane. Thus, the apex of the triangular pyramid deviates from a designed apex setting position C in the lateral direction in the figure, as can be seen from FIGS. 3A, 3B illustrating a designed triangular pyramid and an actually grown pyramid, respectively.

Thus, amounts of two portions of returned light separated by the triangular pyramid differ from each other to generate an offset in a detection signal for the focus servo based on the knife edge method.

In order to avoid the formation of the {110} crystal plane 63a on the boundary, it can be considered to increase the crystal growth rate on the {110} crystal plane 63a. However, the {110} crystal plane 63 and the {111} A crystal plane 61 exhibit substantially the same tendency with respect to the growth rate. Thus, as the growth rate on the {110} crystal plane 63a is increased, the growth rate on the {111} A crystal plane 61 is also increased. As a consequence, the {110} crystal plane 63a still remains on the boundary of the two crystal planes.

To solve the foregoing problem, a condition which prevents the {111} A crystal plane 61 and the {110} crystal plane 63 from completely growing, i.e., high temperature growth may be employed. However, since the triangular pyramid is grown after the laser is formed, the high temperature growth significantly affects the laser. Specifically, the high temperature would cause impurities to diffuse in the laser, thereby inevitably affecting the reliability of the laser.

In addition, if the high temperature growth is conducted at excessively high temperatures, the growth on the {111} B crystal plane 62 is also initiated so that the {110} crystal plane 63a again appears.

OBJECTS AND SUMMARY OF THE INVENTION

To solve the problems mentioned above, it is an object of the present invention to provide a triangular pyramidal semiconductor structure which is capable of precisely splitting light by preventing an unnecessary crystal plane from growing on the boundary between side surfaces of the triangular pyramid.

It is another object of the present invention to provide an optical device employing such a triangular pyramidal semiconductor structure.

According to an aspect of the present invention, there is provided a triangular pyramidal semiconductor structure which is surrounded by either one of a {111} A crystal plane and a {111} B crystal plane and two {110} crystal planes formed on a substrate.

According to another aspect of the present invention, there is provided an optical device which includes a light-emitting element, a reflecting mirror, and a light-receiving element, wherein the reflecting mirror is formed of a triangular pyramidal semiconductor structure which is surrounded by either one of a {111} A crystal plane and a {111} B crystal plane and two {110} crystal planes, the reflecting mirror is positioned to reflect a light emitted from the light-emitting element, and light emitted from the light-emitting element and returned from an irradiated body is reflected by the reflecting mirror such that the light-receiving element receives light reflected by the reflecting mirror.

According to the above-mentioned structure of the present invention, the triangular pyramid is formed of the {111} A crystal plane or the {111} B crystal plane and the two {110} crystal planes, so that the triangular pyramid can be fabricated without producing another crystal plane on the boundary between the two crystal planes.

Also, since the returned light from the irradiated body is reflected by the reflecting mirror having the triangular pyramidal semiconductor structure surrounded by either one of the {111} A crystal plane and the {111} B crystal plane and the two {110} crystal planes, the returned light is split by the two side surfaces of the {110} crystal planes such that split light portions are received by the light-receiving elements, thereby making it possible to detect a focus servo signal according to a knife edge method.

BRIEF DESCRIPTION OF THE DRAWINGS

FIG. 2 is a top plan view of a triangular pyramidal semiconductor structure;

FIG. 3A is a top plan view illustrating a designed triangular pyramidal semiconductor structure;

FIG. 3B is a top plan view illustrating an actually grown triangular pyramidal semiconductor structure;

FIGS. 4A and 4B are perspective views illustrating triangular pyramidal semiconductor structures according to the present invention;

DETAILED DESCRIPTION OF THE PREFERRED EMBODIMENT

Figure 1:
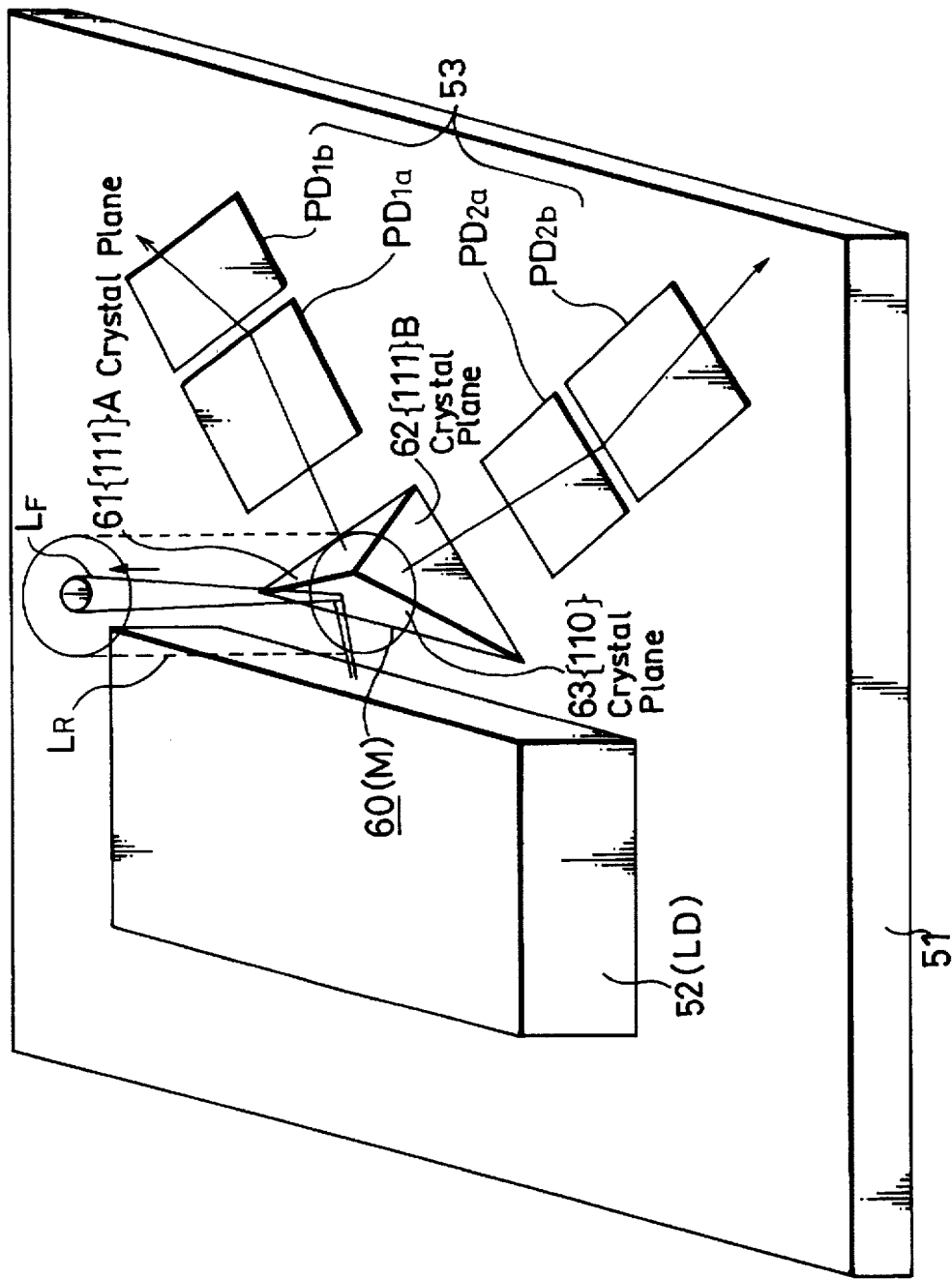
FIG. 1 is a perspective view schematically illustrating the structure of optical apparatus.

A triangular pyramidal semiconductor structure and an optical device using the same according to an embodiment of the present invention will be described with reference to the accompanying drawings.

Briefly, the triangular pyramidal semiconductor structure according to the present invention is surrounded by either of a {111} A crystal plane and a {111} B crystal plane and two {110} crystal planes.

Specifically, as illustrated in a perspective view of a triangular pyramidal semiconductor structure of FIG. 4A, three side surfaces of a triangular pyramid are formed of a {111} A crystal plane 2 and two {110} crystal planes 1 to construct a triangular pyramidal semiconductor structure 11.

Alternatively, as illustrated in a perspective view of another triangular pyramidal semiconductor structure of FIG. 4B, three side surfaces of a triangular pyramid of the semiconductor structure are formed of a {111} B crystal plane 3 and two {110} crystal planes 1 to construct a triangular pyramidal semiconductor structure 12.

Since the triangular pyramid are formed by these crystal planes, an additional plane hardly appears on the boundary between the two crystal planes, an apex of the triangular pyramid is difficult to be displaced.

The triangular pyramidal semiconductor structure 11 or 12 may be used to form an optical device having a light-emitting element and a light-receiving element.

Figure 5:
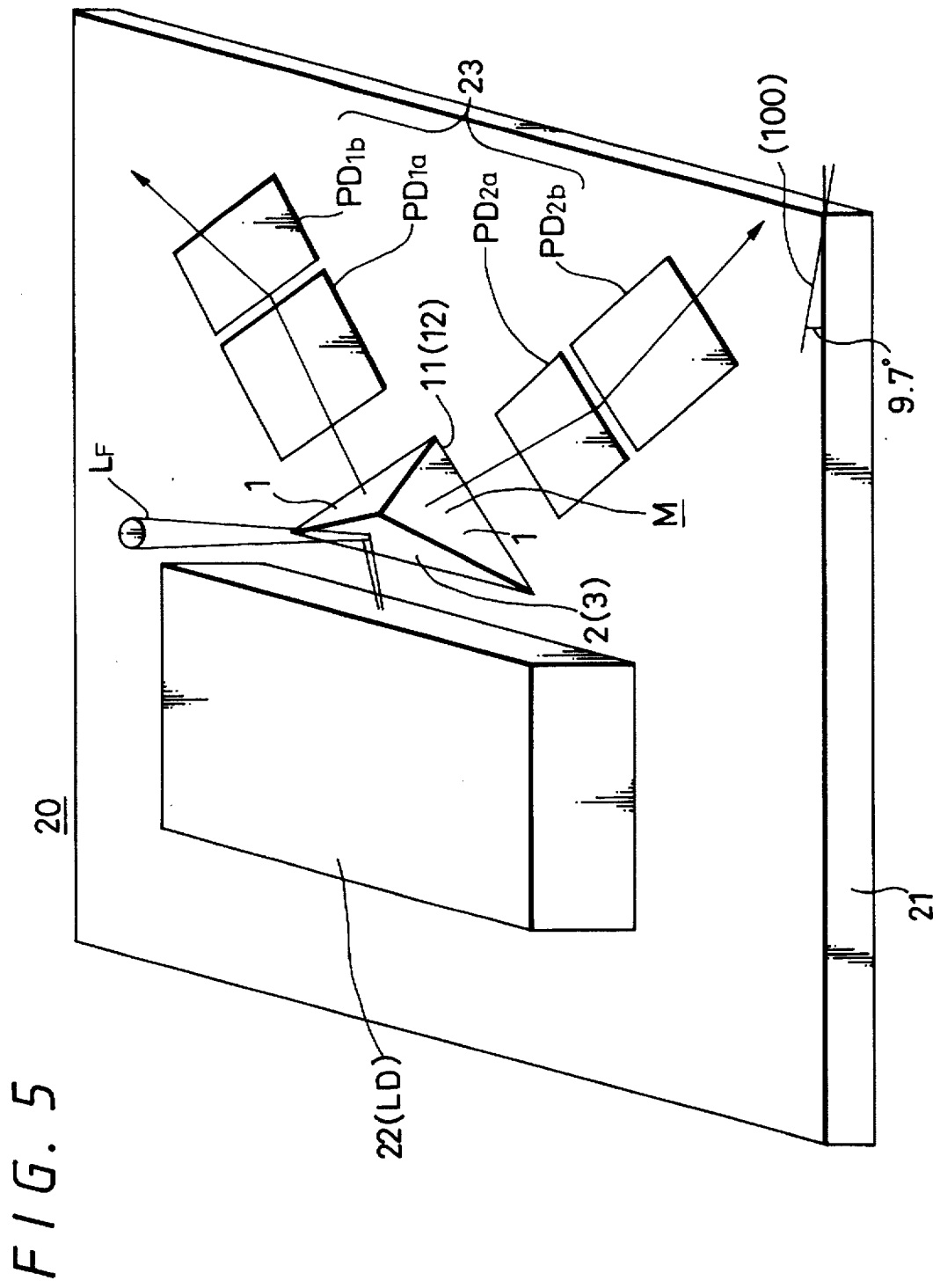
FIG. 5 is a perspective view schematically illustrating an example of an optical device using the triangular pyramidal semiconductor structure according to the present invention.

FIG. 5 schematically illustrates in perspective form an example of an optical device 20 according to the present invention.

The optical device 20 illustrated in FIG. 5 has a light-emitting unit 22 having a semiconductor laser LD, 3 reflecting mirrors M made of a triangular pyramidal semiconductor structure, and a light-receiving element 23 having two pairs of bisected photodiodes $PD_{1a}$, $PD_{1b}$ and $PD_{2a}$, $PD_{2b}$ formed in a monolithic structure on a semiconductor substrate 21 having a substrate surface forming an angle of 9.7° with respect to a (100) crystal plane.

The reflecting mirror M has the triangular pyramidal semiconductor structure 11 or 12, the three side surfaces of which are formed of one of a {111} A crystal plane 2 and a {111} B crystal plane 3 and two {110} crystal planes 1. Among these side surfaces, the side surface formed of the {111} A crystal plane 2 or the {111} B crystal plane 3 is oriented to the light-emitting unit 22, and the two side surfaces formed of the {110} crystal planes 1 are oriented to the two pairs of bisected photodiodes $PD_{1a}$, $PD_{1b}$ and $PD_{2a}$, $PD_{2b}$ of the light-receiving unit 23, respectively.

The optical device 20 is provided with an objective lens (not shown) as a light converging means and other optical assemblies (not shown) to complete an optical apparatus such as an optical pickup.

Light $L_F$ emitted from the semiconductor laser LD of the light-emitting unit 22 is reflected by the side surface formed of the {111} A crystal plane 2 or the {111} B crystal plane 3 of the reflecting mirror M and irradiated upwardly in the figure.

Figure 6:
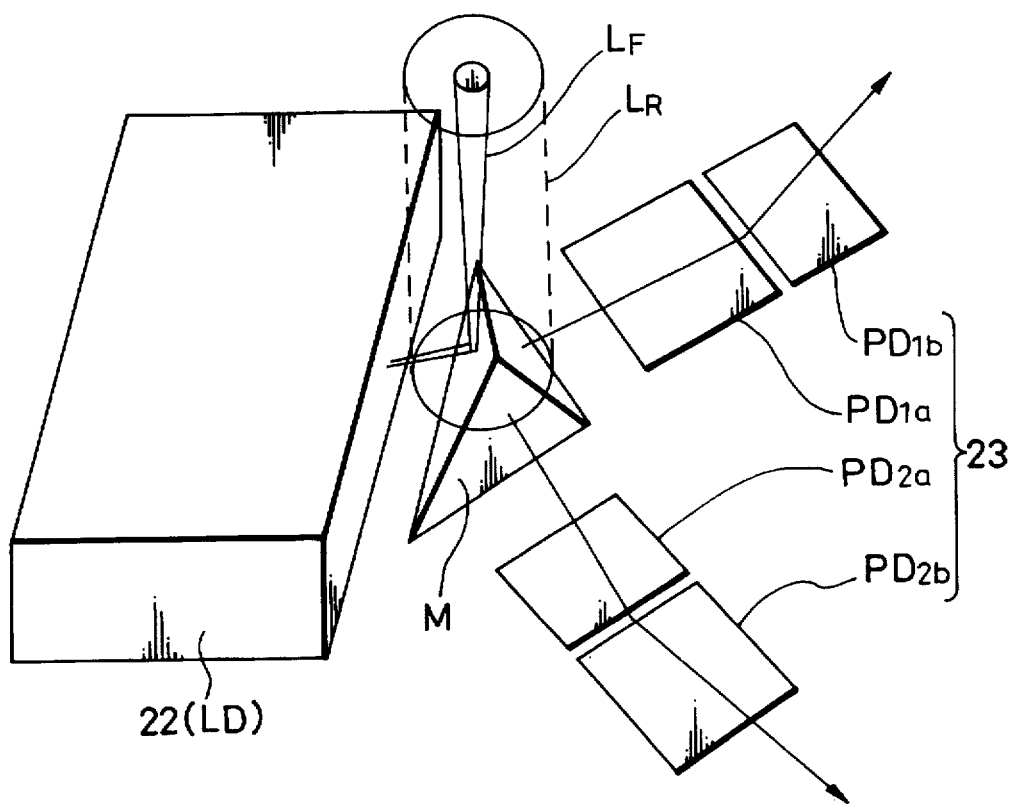
FIG. 6 is a schematic diagram illustrating light paths in the optical device of FIG. 5.

The emitted light $L_F$ passes through the light converging means (not shown) and is reflected by an irradiated body to produce returned light $L_R$. Then, the returned light $L_R$ is irradiated onto the triangular pyramid forming the reflecting mirror M from the upward direction, as indicated by a light path in the optical device of FIG. 5 illustrated in FIG. 6. In this event, the returned light $L_R$ is converged to the light diffraction limit of the light converging means, as mentioned above. The returned light $L_R$ is then reflected by the reflecting mirror M, and light rays reflected by two side surfaces formed of the {110} crystal planes 1 are irradiated to the bisected photodiodes $PD_{1a}$, $PD_{1b}$ and $PD_{2a}$, $PD_{2b}$ of the light-receiving element 23, respectively.

The bisected photodiodes $PD_{1a}$, $PD_{1b}$ and $PD_{2a}$, $PD_{2b}$ are located and formed at positions such that light amounts received by the bisected photodiodes in the respective pairs are equal, i.e., $PD_{1a}=PD_{1b}$ and $PD_{2a}=PD_{2b}$ when the focus of the light converging means is just on the irradiated body.

A variety of signals generated by the irradiated body, for example, an optical disk can be detected, for example, in the following manner.

An RF (radio frequency) signal generated by a pit or the like on a disk can be detected, for example, by a sum signal of all the photodiodes ($PD_{1a}+PD_{1b}+PD_{2a}+PD_{2b}$). A tracking servo signal can be detected, for example, by a difference signal indicative of the difference in reflected light between the two side surfaces (($PD_{1a}+PD_{1b}$)−($PD_{2a}+PD_{2b}$)). A focus servo signal can be detected, for example, by the difference in light-receiving amount between the two photodiodes in the respective pairs, i.e., (($PD_{1a}-PD_{1b}$)+($PD_{2a}-PD_{2b}$)) as a detection signal.

Since the angle formed by the substrate surface of the semiconductor substrate 21 and the (100) crystal plane is 9.7°, an angle formed by the substrate surface and the {111} A crystal plane 2 or the {111} B crystal plane 3 is 45°, whereby the emitted light $L_F$ can be directed perpendicularly to the substrate surface.

Next, an exemplary manufacturing process of the optical device 20 will be described below with reference to FIGS. 7 to 9.

First, a semiconductor substrate 21 made, for example, of GaAs and having a substrate surface deviated by 9.7° from a (100) crystal plane is prepared.

Figure 7:
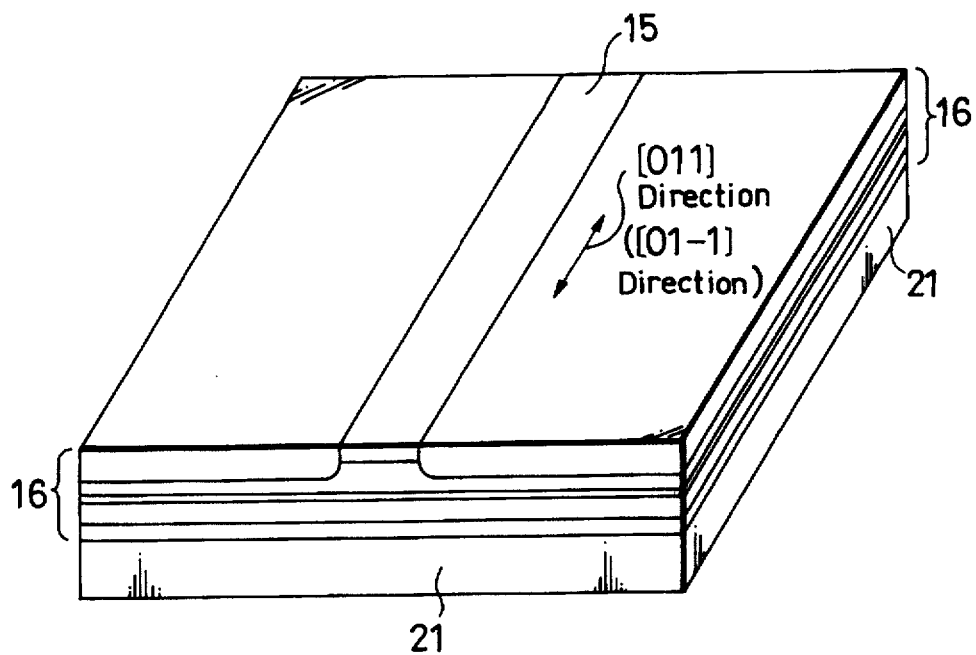
FIGS. 7 to 9 are perspective views illustrating a variety of steps in a manufacturing process for an exemplary optical device using the triangular pyramidal semiconductor structure according to the present invention.

As illustrated in FIG. 7, a first cladding layer of a first conductivity type, an active layer, a second cladding layer of a second conductivity type, and so on (not shown) are stacked in sequence on the semiconductor substrate 21. Then, a horixontal resonator 15 is formed in the second cladding layer by a current limittingg layer or the like to form a semiconductor layer stack film 16 constituting a semiconductor laser LD. In this event, the horizontal resonator 15 is oriented in the [011] direction or in the [01−1] direction.

Figure 8:
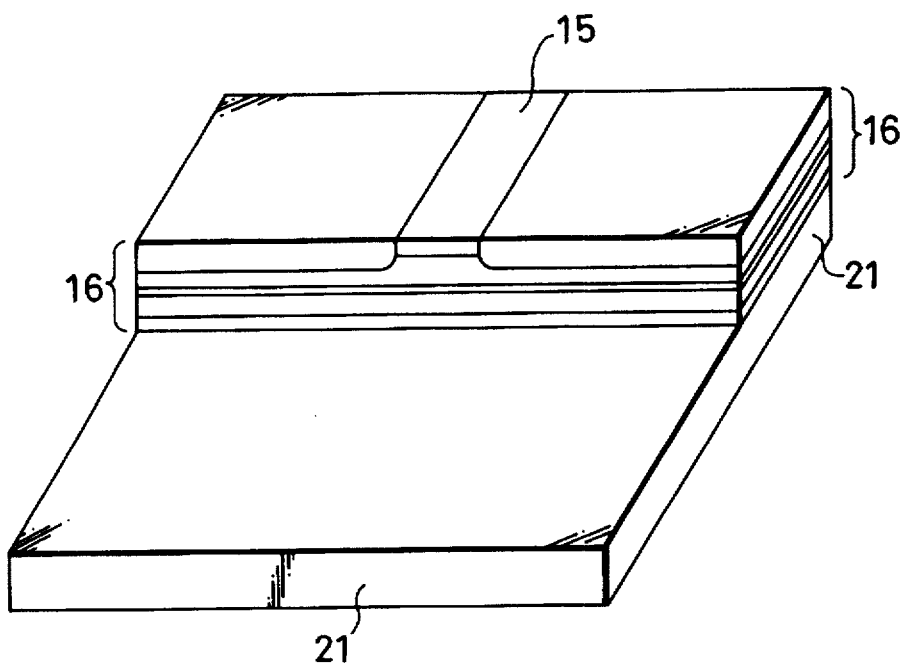
Figure 9:
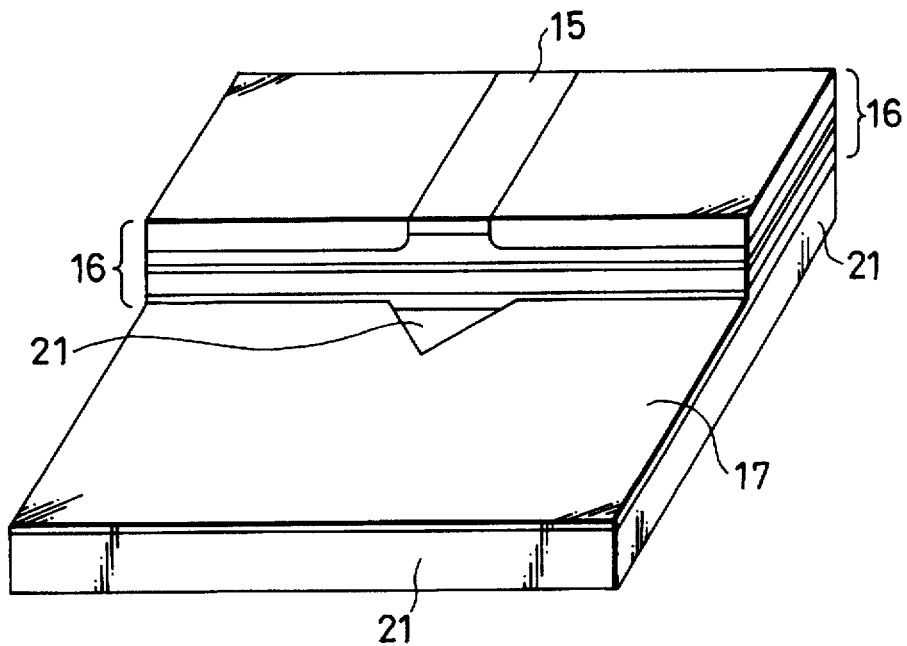

Next, as illustrated in FIG. 8, the semiconductor layer stack film 16 is etched using a mask, for example, by an RIE (reactive ion etching) or the like to form a resonator end surface of the semiconductor laser LD perpendicular to the direction of the horizontal resonator 15.

Next, a triangular pyramidal semiconductor structure is grown in crystals. As illustrated in FIG. 9, a mask 17 made of an insulating material such as SiNx, $SiO_2$, or the like is formed such that an isosceles triangle portion remains on the surface of the etched substrate 21.

The mask 17 is used to grow in crystals a triangular pyramidal semiconductor structure made, for example, of GaAs by an MOCVD (Metal Organic Chemical Vapor Deposition) method using, for example, a methyl based source material. In this case, when the direction of the resonator is determined to be in the [011] direction, the triangular pyramidal semiconductor structure 11 formed of the {111} A crystal plane 2 and the two {110} crystal planes 1 as illustrated in FIG. 4A is grown. On the other hand, when the direction of the resonator is determined to be in the [01−1] direction, the triangular pyramidal semiconductor structure 12 formed of the {111} B crystal plane 3 and the two {110} crystal planes 1 as illustrated in FIG. 4B is grown.

Alternatively, a triangular step may be formed on the surface of the substrate to fabricate the triangular pyramidal semiconductor structure thereon. In this case, the foregoing manufacturing method is modified such that when the resonator end surface is formed by using an etching technique such as the RIE method illustrated in FIG. 8, the etching is performed in two stages to form the triangular step on the substrate.

Figure 10:
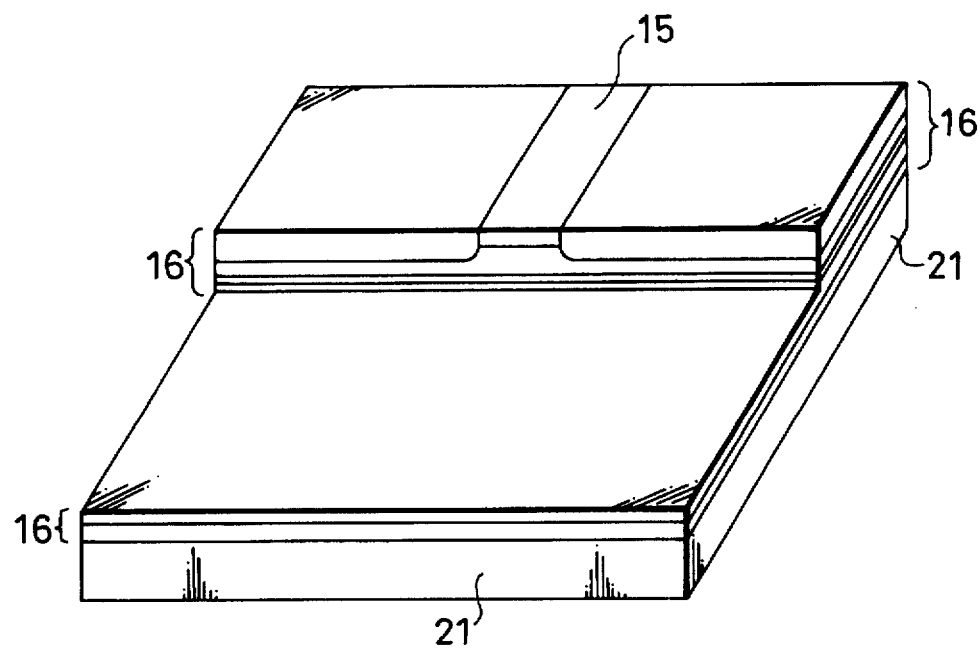
FIGS. 10 to 12 are perspective views illustrating a variety of steps in another manufacturing process for an exemplary optical device using the triangular pyramidal semiconductor structure according to the present invention.

First, as illustrated in FIG. 10, a part of the semiconductor layer stack film 16 is etched away by the first etching process to form a step between the upper surface of the semiconductor layer stack film 16 constituting the semiconductor laser LD and the etched surface.

Figure 11:
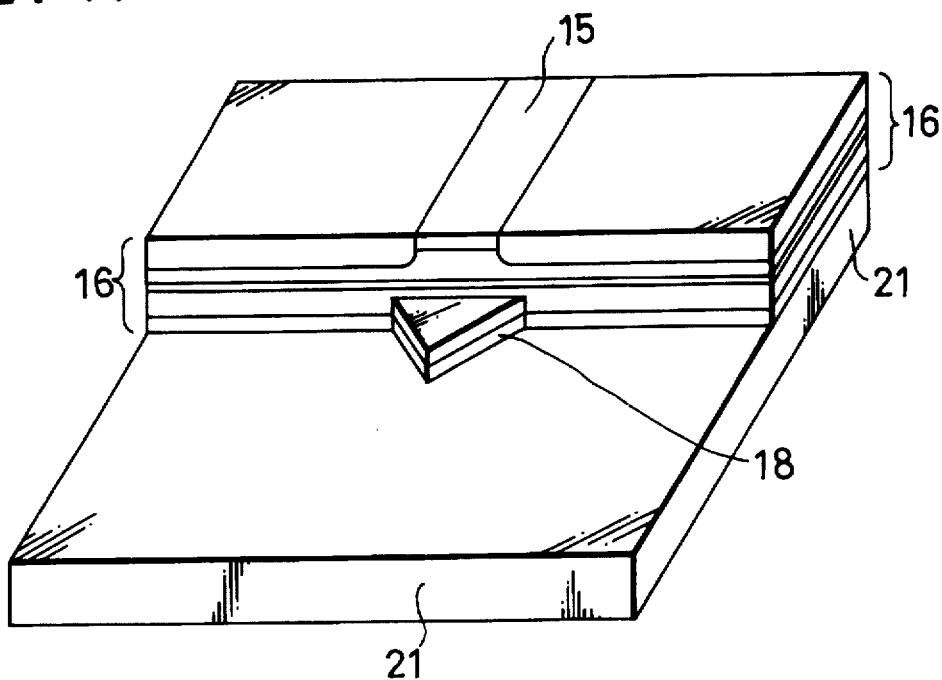

Next, as illustrated in FIG. 11, the remaining portion of the semiconductor layer stack film 16 is further etched by the second etching process so as to leave the step formed in the first etching stage in an isosceles triangle shape. In this process, the step left in the isosceles triangle shape is formed as a triangular pole shaped step 18.

Then, the triangular pyramidal semiconductor structure 11 or 12 is grown in crystals on the triangular pole shaped step 18 by an MOCVD method or the like similar to the aforementioned manufacturing method. Thus, the triangular pyramidal semiconductor structure 11 or 12 is formed on the triangular pole shaped step 18 as illustrated in FIG. 12.

Figure 12:
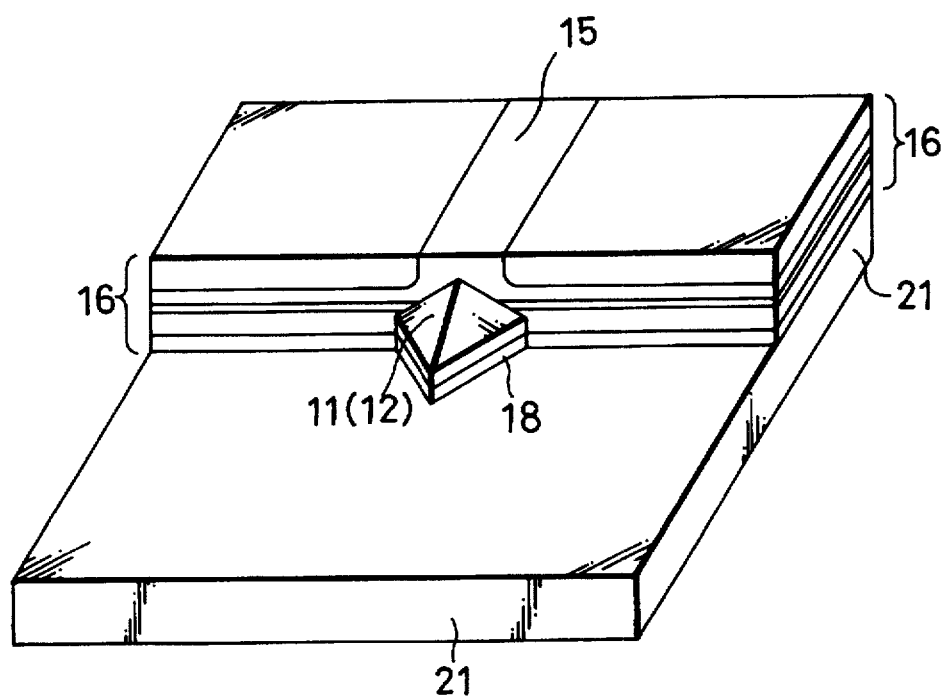

Referring specifically to FIG. 12, when the triangular pyramidal semiconductor structure 11 or 12 is formed on the triangular pole shaped step 18 and it is applied to the optical device 20 as illustrated in FIG. 5, the triangular pole shaped step 18 causes a level difference between the triangular pyramidal semiconductor structure 11 or 12 and the surface on which the light-receiving element 23 is formed, i.e., the substrate surface of the semiconductor substrate 21. By virtue of this level difference, wider spots of light can be irradiated to the substrate surface when the light is reflected by the reflecting mirror M having the triangular pyramidal semiconductor substrate 11 or 12. Thus, when the wider spots of light are received by the bisected photodiodes to detect a focus servo signal, larger changes in spot positions are detected when the spots are defocused, to facilitate the detection of the focus servo signal.

While in the foregoing embodiment, the triangular pyramidal semiconductor structure has been used as a reflecting mirror for an optical device forming the CLC configuration, the triangular pyramidal semiconductor structure of the present invention can be applied to an optical apparatus which does not have a light-emitting unit and a light-receiving unit formed in a monolithic structure, for example, an optical device having a light-emitting unit and a light-receiving unit formed on a substrate in a hybrid structure, an optical device having a light-emitting unit and a light-receiving unit separated from each other, and so on. In these applications, the triangular pyramidal semiconductor structure can be similarly used, for example, as a reflecting mirror for redirecting emitted light to the upward direction and for separating returned light.

In addition, the triangular pyramidal semiconductor structure may be used as an optical element for splitting an optical path into three and applied as any other semiconductor structure.

As described above, even when a triangular pyramidal semiconductor structure is formed separate from a semiconductor laser LD, the triangular pyramidal semiconductor structure can be formed, similarly to the foregoing manufacturing method, by leaving a triangle-shaped region in a mask made of an insulating material to selectively grow the structure on the triangle-shaped region or by forming a triangular pole shaped step on the semiconductor substrate to grow the structure on the step in crystal.

It should be further noted that the triangular pyramidal semiconductor structure and an optical device using the same, according to the present invention, are not limited to the specific examples described above, and a variety of other modifications in form and details may be made without departing from the spirit and scope of the invention.

According to the triangular pyramidal semiconductor structure of the present invention described above, the side surfaces of the triangular pyramid are formed of either the {111} A crystal plane or the {111} B crystal plane and the two {110} crystal planes to eliminate the formation of an additional crystal plane on the boundary between the crystal planes.

Therefore, when the triangular pyramidal semiconductor structure of the present invention is used as a reflecting mirror in an optical device, returned light from an irradiated body can be efficiently split by the reflecting mirror to provide reflected light in two directions. The reflected light in two directions can be received by associated light-receiving elements to detect a focus servo signal in accordance with the knife edge method without generating an offset.

When a triangular pyramidal semiconductor structure is fabricated on a triangular pole shaped step formed on the surface of a semiconductor substrate and applied to an optical device having light-receiving elements, light reflected by the side surfaces of the triangular pyramidal semiconductor structure is irradiated to the surface of the substrate as wider spots because of a level difference between the triangular pyramidal semiconductor structure and the surface of the semiconductor substrate. It is therefore possible to facilitate the detection of a focus servo signal and so on with the wider spots of light.

Also, since the angle formed by a reflective surface of the triangular pyramidal semiconductor structure and the substrate surface of the semiconductor substrate is selected to be 45°, emitted light can be directed perpendicularly to the substrate surface.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A triangular pyramidal semiconductor mirror structure formed on a substrate, and having one side being one of a {111} A crystal plane and a {111} B crystal plane and two sides being {110} crystal planes formed on a substrate.

2. A triangular pyramidal semiconductor mirror structure according to claim 1, further having a step formed on the substrate, said step having a triangular upper surface, wherein said triangular pyramidal semiconductor structure is formed on said triangular upper surface of said step.

3. A triangular pyramidal semiconductor mirror structure according to claim 1, wherein said substrate has a substrate surface deviated by 9.7% from a (100) crystal plane.

4. An optical device comprising:

a light-emitting element;

a reflecting mirror; and a light-receiving element, wherein said reflecting mirror includes a triangular pyramidal semiconductor mirror structure formed on a substrate and having one side being one of a {111} A crystal plane and a {111} B crystal plane and two sides being {110} crystal planes, wherein said reflecting mirror is positioned to reflect light emitted from said light-emitting element, and light emitted from said light-emitting element and returned from an irradiated body is reflected by said reflecting mirror such that said light-receiving element receives the light reflected by said reflecting mirror.

5. An optical device according to claim 4, wherein an angle formed by a reflective surface of said reflecting mirror and the substrate surface of said semiconductor substrate is substantially 45°.

6. An optical device according to claim 4, wherein either one of said {111} A crystal plane and said {111} B crystal plane is positioned opposite to an emitting plane of said light-emitting element, and said two {110} crystal planes are positioned opposite to said light-receiving element.

* * * * *